United States Patent [19]
Michelson

[11] Patent Number: 5,406,311
[45] Date of Patent: Apr. 11, 1995

[54] STORING A DIGITIZED STREAM OF INTERLACED VIDEO IMAGE DATA IN A MEMORY IN NONINTERLACED FORM

[75] Inventor: Henry S. Michelson, North Andover, Mass.

[73] Assignee: Data Translation, Inc., Marlboro, Mass.

[21] Appl. No.: 111,390

[22] Filed: Aug. 25, 1993

[51] Int. Cl.$^6$ .............................................. G09G 5/36
[52] U.S. Cl. .................................... 345/200; 348/448; 348/715; 345/196
[58] Field of Search ............... 345/200, 196, 201, 197, 345/203, 185; 348/448, 715; H04N 5/907; 365/230.05

[56] References Cited

U.S. PATENT DOCUMENTS

| | | | |
|---|---|---|---|
| 4,660,070 | 5/1993 | Nishi et al. | |
| 4,698,674 | 10/1987 | Bloom | 348/448 |
| 5,319,603 | 6/1994 | Watanabe | 365/230.05 |

OTHER PUBLICATIONS

Product Literature for Mitsubishi Electric Part No. M5M442256AJ, AL-7, -8, -10.

Primary Examiner—Alvin E. Oberley
Assistant Examiner—Kent W. Chang
Attorney, Agent, or Firm—Fish & Richardson

[57] ABSTRACT

Apparatus for storing interlaced video data in a split video memory in noninterlaced form in real video time and without wasted RAM space through the use of a video memory controller that controls transfers between a serial access memory (SAM) including a lower SAM (LSAM) and upper SAM (USAM) and a random access memory (RAM) including a lower RAM (LRAM) and an upper RAM (URAM) of the video memory during free time between video lines when pixel data are not being received, the video memory controller transmitting transfer control signals to the video memory to cause data stored in the LSAM and USAM to be written to the proper page location in the LRAM and URAM after a line has been written in order to save the data before receiving the next line, the controller also generating transfer control signals to cause data in the LRAM and URAM to be read back into the LSAM and the USAM before receiving new data in order to save data that may have already been written into the same page (e.g., from a prior field) at locations adjacent to those for the line being written, the video memory controller also generating a tap control signal causing the next line of digitized data to be stored in the SAM at a location spaced from the location of the most recently stored data to provide space necessary for storage of data of a video line.

38 Claims, 9 Drawing Sheets

STORING A DIGITIZED STREAM OF INTERLACED VIDEO IMAGE DATA IN A MEMORY IN NONINTERLACED FORM

BACKGROUND OF THE INVENTION

The invention relates to storing a digitized stream of interlaced video image data in a memory in noninterlaced form.

Frames of digitized video data are often stored in a video memory including a random access memory (RAM) and a serial access memory (SAM). The RAM is organized so as to be addressed by column addresses and row addresses, each storage location being identified by a unique combination of a column address and a row address. The locations having the same row address are considered a "page", and within a page, each column address identifies a pixel storage location. The SAM has enough storage for a page, and data can be transferred between the SAM and the RAM. In split video memories, the SAM is divided into a lower SAM (LSAM) that corresponds to lower column addresses and an upper SAM (USAM) that corresponds to upper column addresses. In split memories, transfer can be made between the entire SAM and a page of the RAM at one time, or transfer can be made between the LSAM and corresponding lower column address locations in a page of the RAM or between the USAM and corresponding upper column address locations in a page of the RAM.

In interlaced video, a frame is divided into two fields which are transmitted one after the other; one field contains the even lines of a frame, and the other field contains the odd lines of the frame. When capturing a frame, it is desirable to store the pixel data in noninterlaced form, requiring that pixel data for lines from the second field being received be stored in locations in the memory left between the lines of the first field.

Another consideration that must be addressed in capturing frames is the fact that the length of horizontal lines in a digitized field of pixel data typically is shorter than a page width. One simply cannot continuously write the pixel data into RAM when going from one page to another in the middle of a video line, as pixel data would be lost in the discrete amount of time that is necessary for changing page addresses. If a single line is stored on each page, to avoid loss of data when changing pages during receipt of a line, there is wasted RAM space after each line.

A prior art technique for storing pixel data in a video RAM seamlessly (without gaps) involves using a buffer to temporarily store incoming pixel data before reading into the memory as necessary while changing page boundaries.

SUMMARY OF THE INVENTION

The invention features, in general, apparatus for storing interlaced video data in a video memory in noninterlaced form in real video time and without wasted RAM space through the use of a video memory controller that controls transfers between a SAM and a RAM of the video memory during free time between video lines when pixel data are not being received. A video memory controller transmits transfer control signals to the video memory to cause data stored in the LSAM and USAM to be written to the proper page location in the LRAM and URAM after a line has been written in order to save the data before receiving the next line. The controller also generates transfer control signals to cause data in the LRAM and URAM to be read back into the LSAM and the USAM before receiving new data in order to save data that may have already been written into the same page (e.g., from a prior field) at locations adjacent to those for the line being written. The video memory controller also generates a tap control signal causing the next line of digitized data to be stored in the SAM at a location spaced from the location of the most recently stored data to provide space necessary for storage of data of a video line.

In some cases, the transfer control signal causes the data read back from the LRAM and URAM to be read from the same row. In some cases the transfer control signal causes the data read from the LRAM and URAM to be read from different rows.

In preferred embodiments, the video memory controller includes an address generator that generates a column address to identify a tap position with respect the next line to be stored in the SAM and a row address to identify a page in the RAM for a transfer between the RAM and the SAM. The video memory controller also includes a master state machine that controls the address generator and generates transfer read and transfer write signals and a tap movement signal to control the video memory.

The address generator includes a column address accumulator (CAA), a row address accumulator (RAA), a start address register, a pitch register, a prior column address register, a prior row address register, and various multiplexers. The column address accumulator (CAA) adds the pitch P to the current column address upon receiving a CAA enable signal from the state machine. The CAA has an overflow output that outputs an end of page flag (EOPF) signal when the CAA overflows upon reaching a value equal to the page width of the RAM. The row address accumulator (RAA) adds the EOPF signal to the current row address value upon receiving the RAA enable signal. The start address register provides its output as an input to the CAA or the RAA through respective RA and CA input multiplexers when the RA and CA input multiplexers receive an initial state control signal from the state machine in an asserted state. The pitch register provides its P output as an input to the CAA through the CA input multiplexer when the initial state control signal is in an unasserted state. The prior column address register receives as its input the column address output by the CAA and is enabled by the CAA enable control signal. The prior row address register receives as its input the row address output by the RAA and is enabled by the RAA enable control signal. A CA/RA multiplexer selectively outputs either the column address received from the CAA or the row address received from the RAA as its output. A current/prior CA multiplexer selectively outputs either the column address output by the CAA or the column address output by the prior column address generator. A current/prior RA multiplexer selectively outputs either the row address output by the RAA or the row address output by the prior row address generator.

The state machine uses the EOPF signal as a condition to determine transitions out of some of its states. The state machine maintains an end of line (EOL) flag and a beginning of line (BOL) flag to indicate whether the column address in the CAA identifies an EOL or a BOL. The state machine has a first state in which the EOL flag is asserted, and a second state in which the BOL flag is asserted, the state machine transitioning from the first state to the second state after the initiation of a horizontal synchronization pulse, P being added to the current column address in the CAA in the first state and in the second state.

When the EOPF is asserted at the same time that the BOL flag is asserted, the state machine transitions to a state in which the state machine causes the contents of the SAM to be written to a page of the RAM, and the contents of the same page of the RAM to be written into the SAM.

When the EOPF is asserted at the same time that the EOL flag is asserted, the state machine transitions to a state in which the state machine causes the contents of the SAM to be written to a page of the RAM, and the contents of the same page of the URAM to be written into the USAM and the contents of the next page of the LRAM to be written into the LSAM. In the last mentioned state, the contents of the USAM are written to the URAM after the tap pointer has moved from the USAM to the LSAM and while data are being read into the LSAM. The state machine thereafter transitions to a state in which the contents of the LSAM are written to the LRAM after the data from the same line that had been stored in USAM have been written into the URAM.

The state machine also has a state into which the state machine transitions after the initiation of a vertical synchronization pulse, and a state in which the state machine causes the CAA to add P to column address in preparation for receiving an odd field.

The video memory has a plurality of banks of RAM that are all addressed by the same address bus and controlled by the same control signals, and the video memory controller includes a serial clock generator that receives a pixel clock as an input and outputs a plurality of phase shifted serial clocks for respective banks of RAM. The video memory controller also includes a video control input generator that receives horizontal synchronization pulses and vertical synchronization pulses as inputs and outputs timing and status signals to the master state machine.

Other advantages and features of the invention will become apparent from the following description of the preferred embodiment thereof and from the claims.

DESCRIPTION OF THE PREFERRED EMBODIMENT

The drawings will now be described.

Drawings

Figure 5:
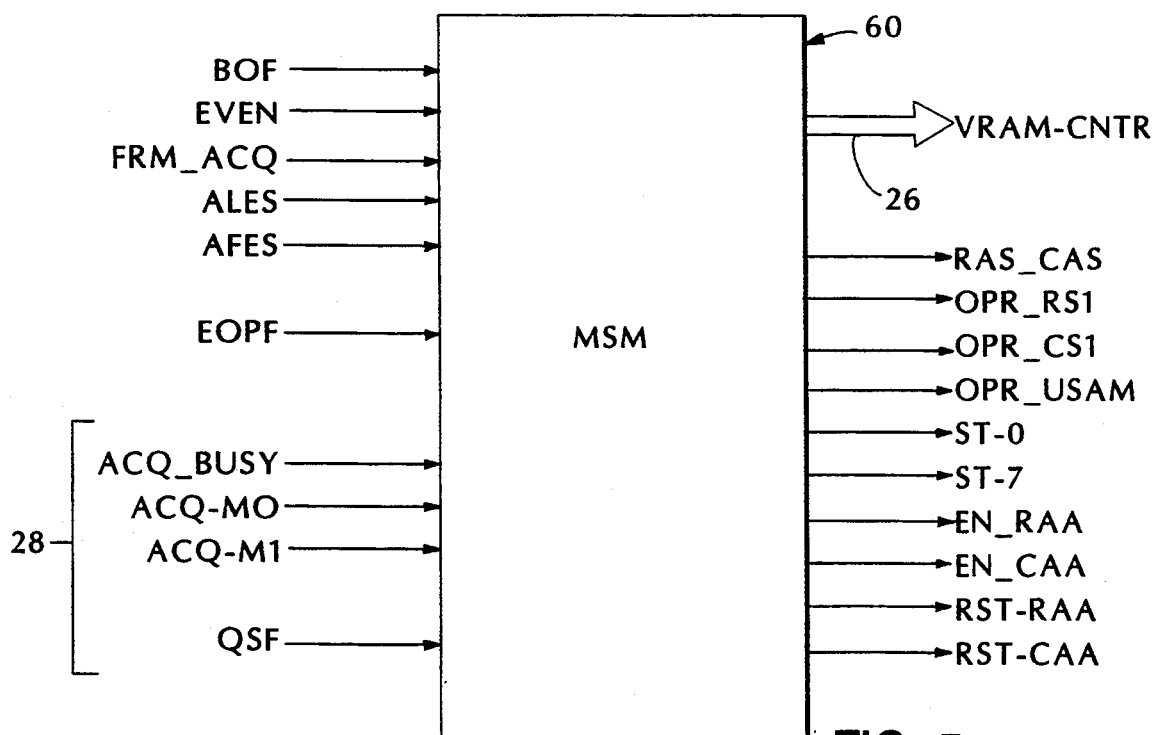
FIG. 5 is a block diagram of a master state machine of the FIG. 1 video memory controller.
Figure 10:
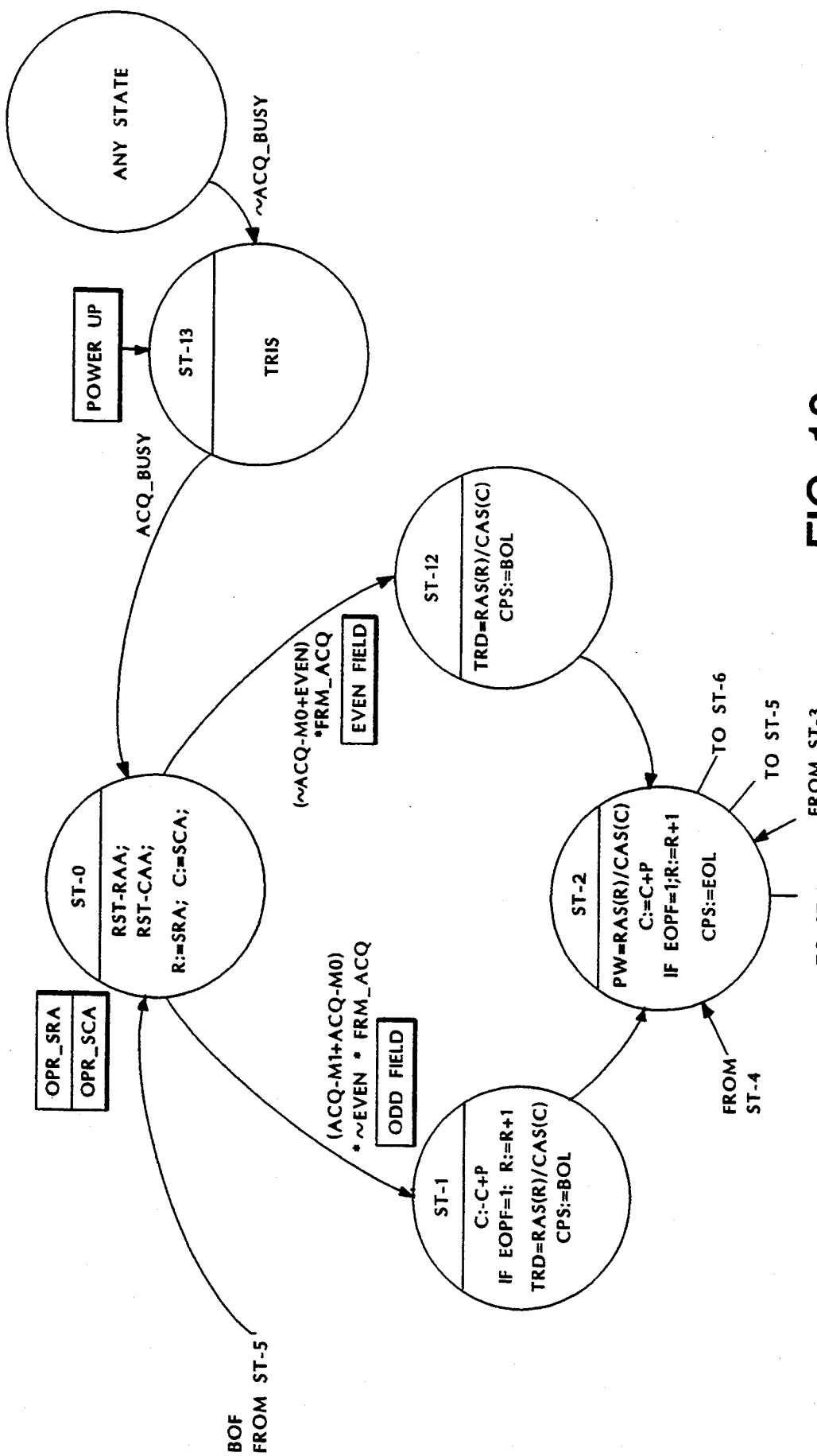
Figure 11:
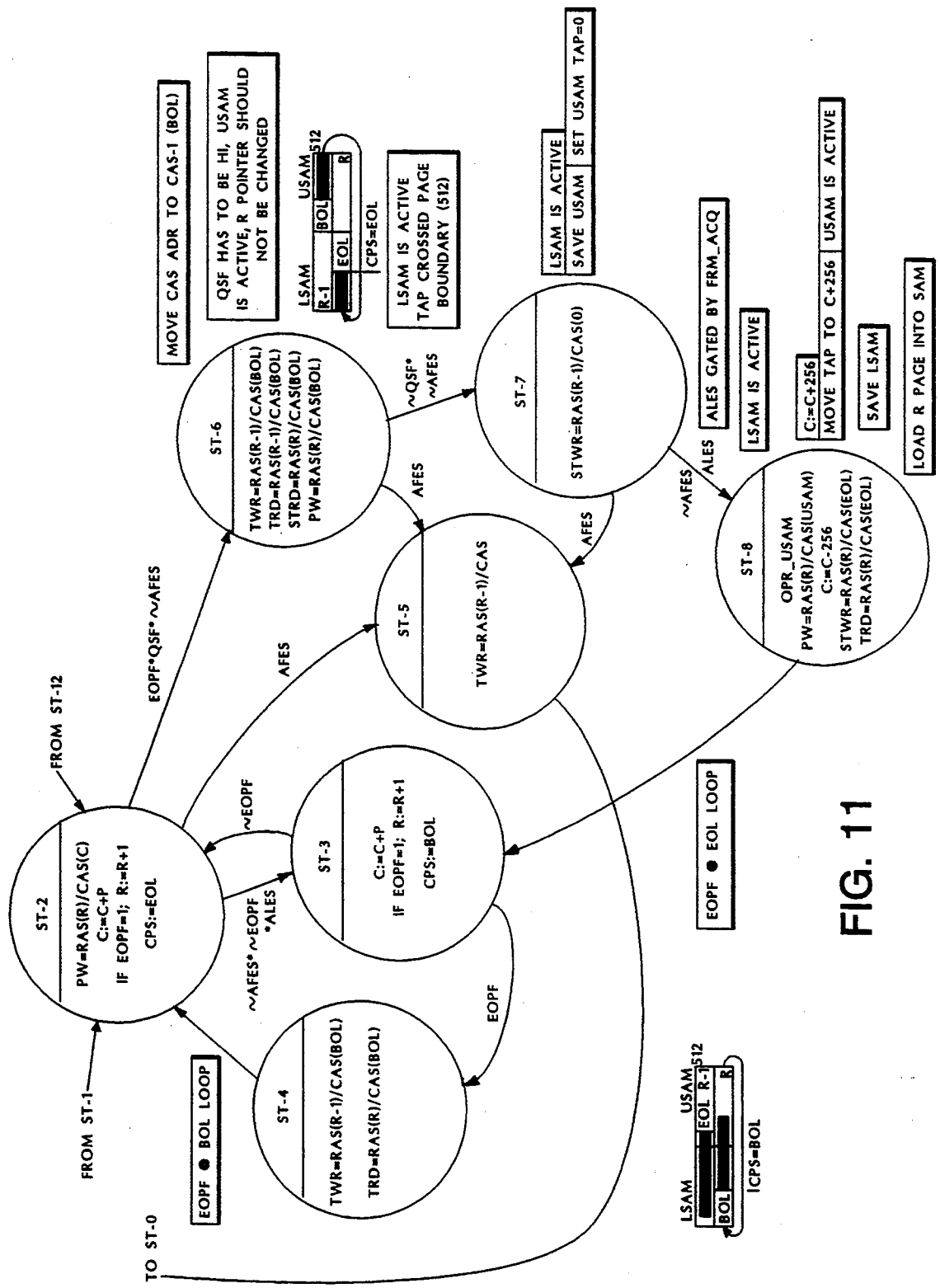

FIGS. 10-11 together are a state diagram showing the states of the FIG. 5 master state machine.

Figure 4:
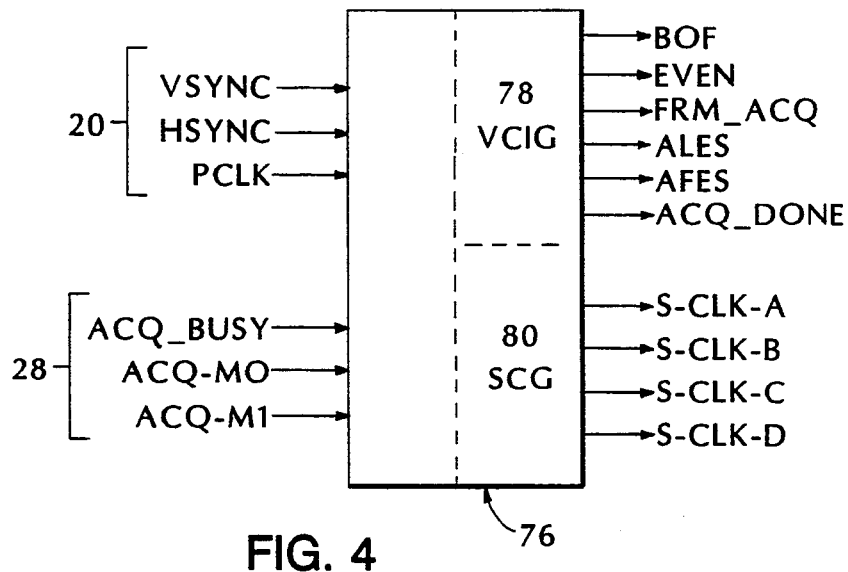
FIG. 4 is a block diagram of a video RAM serial clock generator of the FIG. 1 video memory controller.
Figure 12:
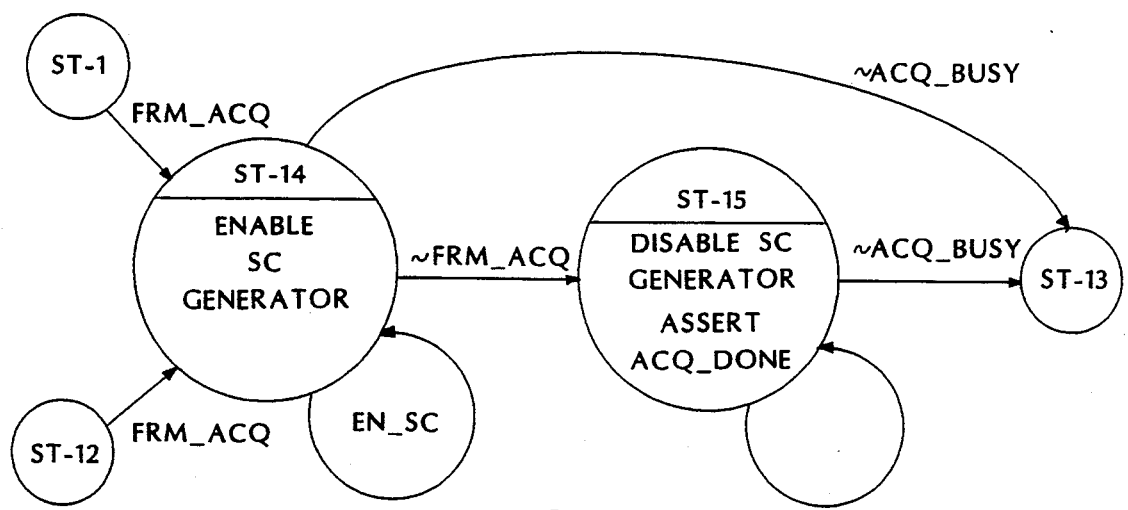

FIG. 12 is a diagram showing the states of the serial clocks of the FIG. 4 serial clock generator.

Figure 13:
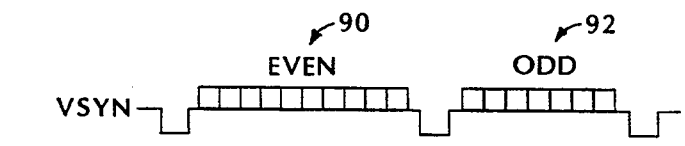
Figure 14:
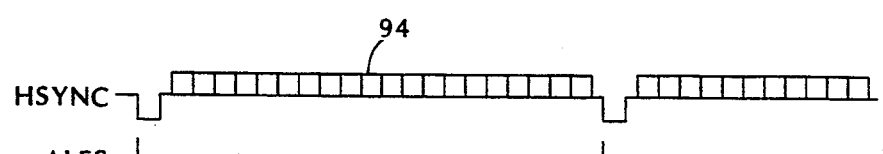

FIGS. 13 and 14 are timing diagrams showing the relationships of vertical synchronization and horizontal synchronization pulses, respectively, with the input video data and control signals derived therefrom.

Structure

Figure 1:
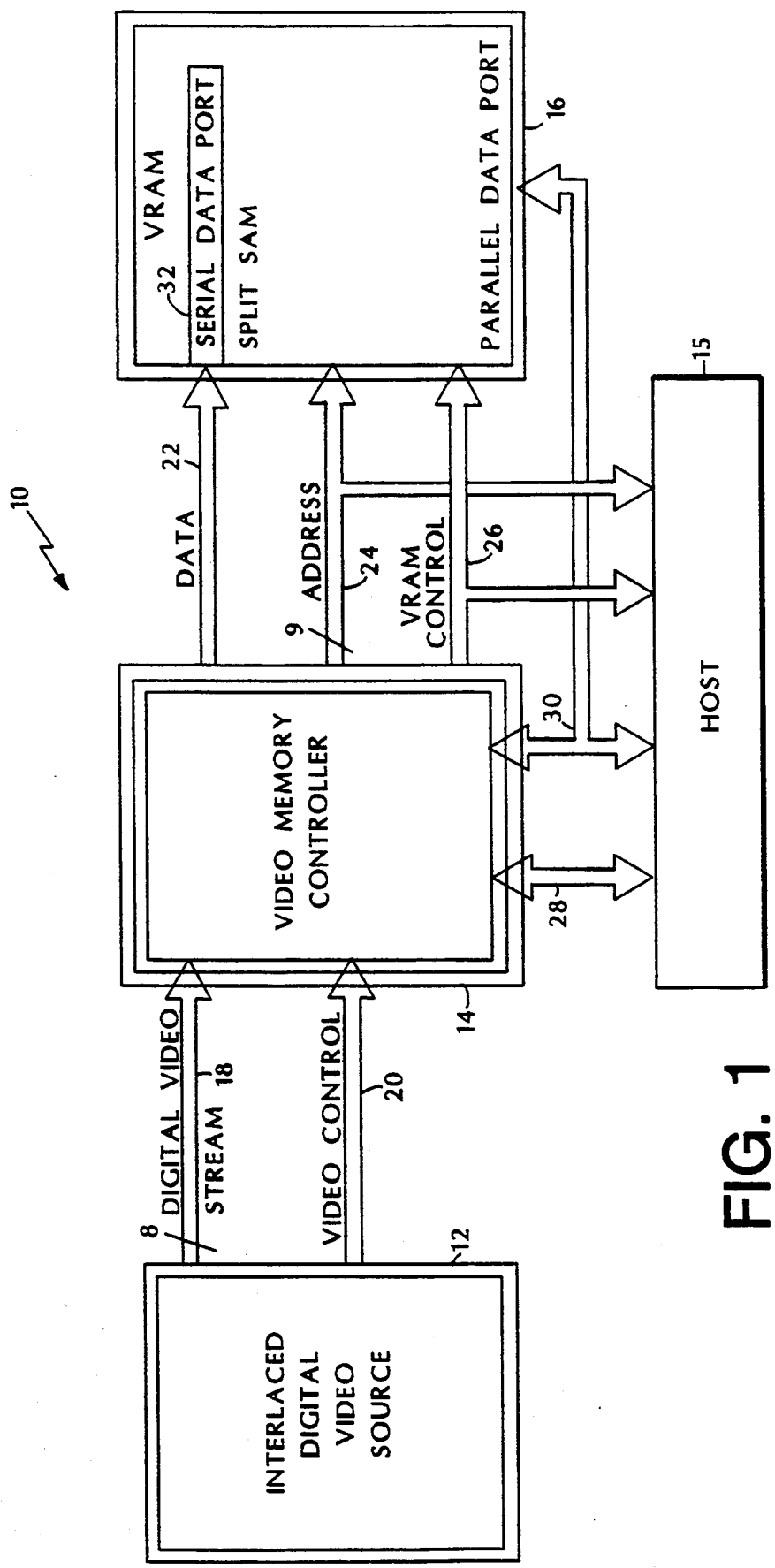
FIG. 1 is a block diagram of circuitry for storing interlaced video image data in a noninterlaced form according to the invention.
Figure 7:
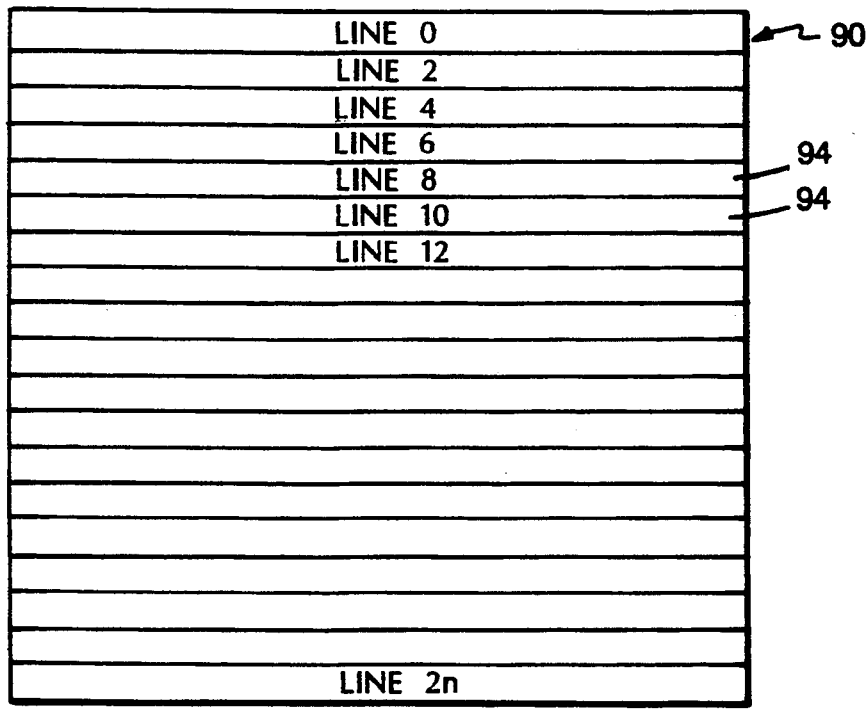
FIGS. 7 and 8 are diagrams of even and odd video fields, respectively, of interlaced video image data.
Figure 8:
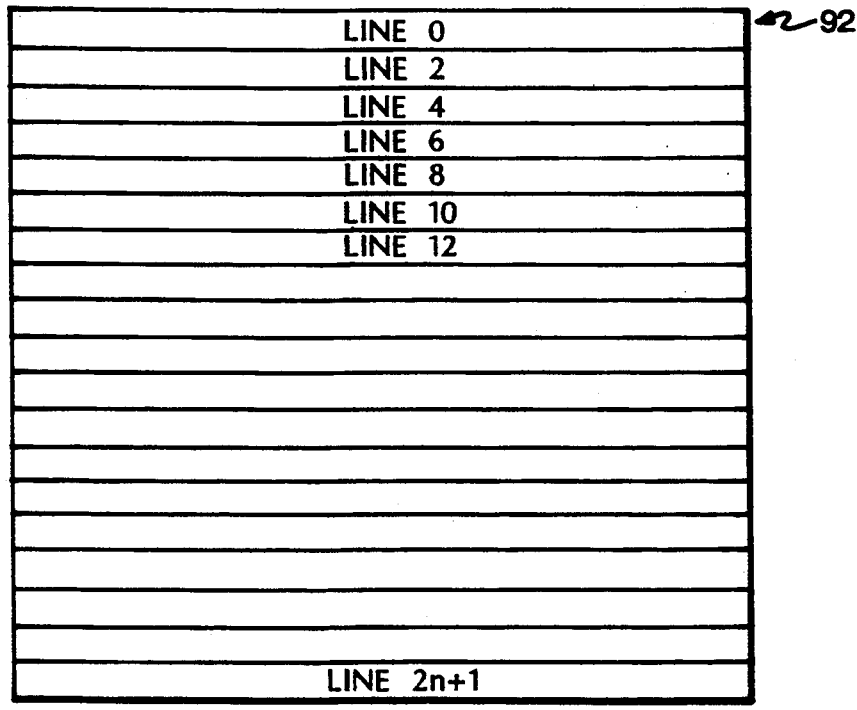

Referring to FIG. 1, circuitry 10 includes source 12 of interlaced digital video data, video memory controller 14 and video random access memory (RAM) 16, e.g., a 1048576-bit dual-port dynamic RAM available from Mitsubishi Electric under the M5M442256AJ trade designation. Video memory controller 14 receives interlaced fields of video data shown in FIGS. 7 and 8 one after the other in real time and generates addresses and control signals to store the data in video RAM 16 in real time in noninterlaced form. Source 12 is connected to video memory controller 14 via 8-bit digital video bus 18 and video control bus 20. Video memory controller 14 is connected to video RAM 16 via 32-bit video data bus 22, nine-bit address bus 24, and video RAM control bus 26. Host computer 15 is connected to video memory controller 14 via host control bus 28 and host data bus 30 and can also access buses 24, 26. Host data bus 30 is also connected to video RAM 16. Data bus 22 is connected to serial data port 32 of serial access memory 98 (FIG. 9) of video RAM 16.

Video memory controller 14 includes address generator 34 (FIG. 2) to generate start addresses for lines of pixel data being written in video RAM 16, video data expander 62 (FIG. 3) to expand the 8-bit input data into 32-bit data on bus 22, VRAM serial clock generator 76 (FIG. 4) to generate clock and timing control signals from the input video data, and master state machine 60 (FIG. 5) to control address generator 34 and video RAM 16. In place of state machine 60, a processor could be used.

Figure 2:
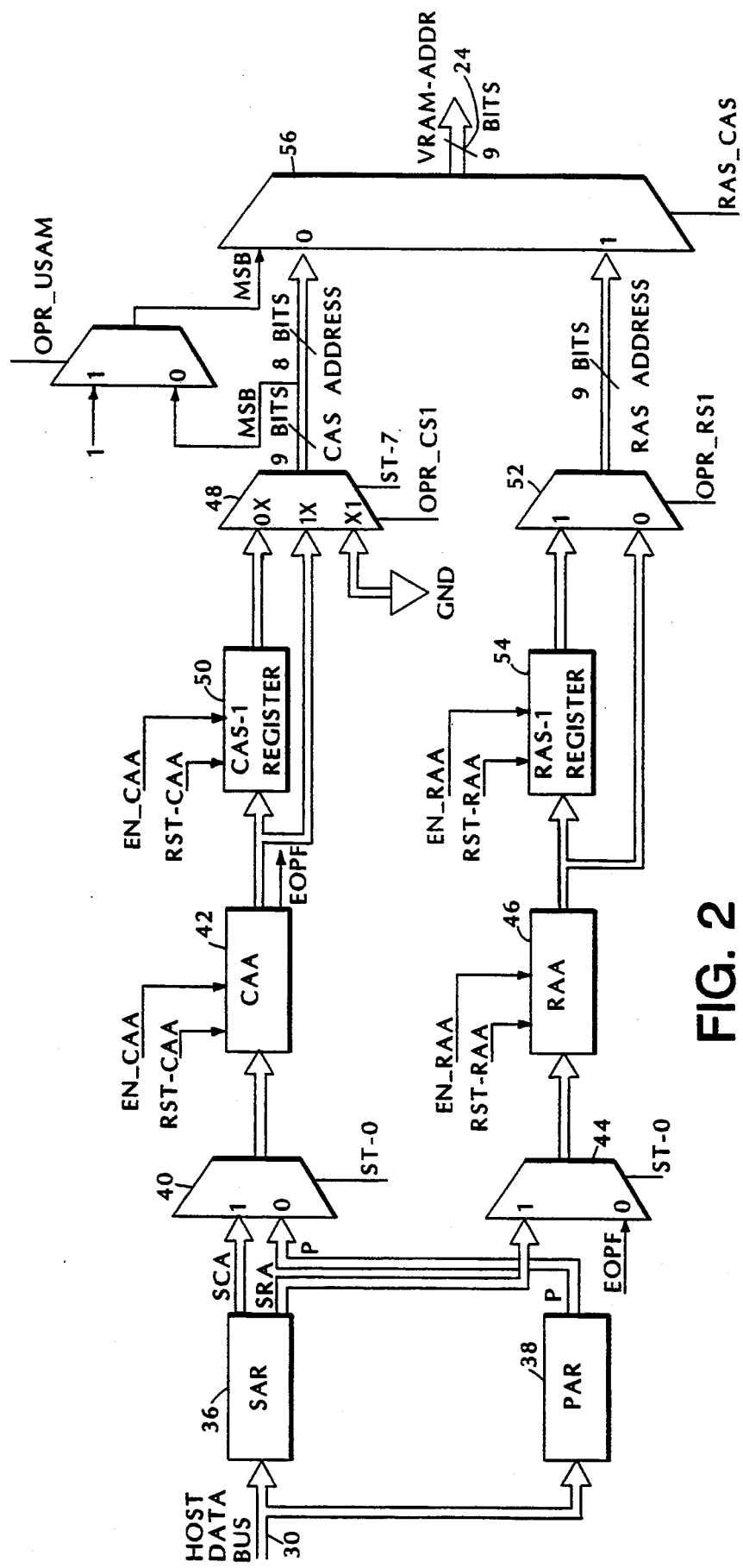
FIG. 2 is a block diagram of an address generator of a video memory controller of the FIG. 1 circuitry.

Referring to FIG. 2, address generator 34 includes start address register 36 connected to host data bus 30 to receive and hold a beginning row address (RA) and column address (CA). (As discussed in detail later, video RAM 16 (FIG. 9) is organized to store pixel data at the intersection of a CA and an RA. The CA and RA stored in start address register 36 thus define where the data for the first pixel of a frame will be stored (usually at row 0 and column 0), and the remaining pixel data are stored linearly at positions after the start address.) Pitch register 38 is also connected to host data bus 30 and is used to hold the horizontal line pixel number (P) specifying the number of pixels in a line of incoming video data.

CA input multiplexer 40 is connected to selectively transfer either the P output from pitch register 38 or the start column address output (SCA) of start address register 36 through to column address accumulator (CAA) 42. CAA 42 is used to add P to the current CA during the acquiring process according to signals from state machine 60 (FIG. 5). (As discussed later, this is done to permit video memory controller 14 to look ahead to identify the starting address for the next line in the field being input, skipping over the memory addresses for a line from the other field to be stored between the lines the field presently being input.)

RA input multiplexer 44 is connected to transmit either the start row address (SRA) from start address register 36 or the end of page flag (EOPF) to row address accumulator (RAA) 46. RAA 46 increments the current RA during the acquiring process according to signals from state machine 60. Both multiplexers 40 and 44 are controlled by ST-0, an initial state control signal from master state machine 60.

The output of CAA 42 is connected to both current/prior CA multiplexer 48 and to prior column address register 50, which holds a previous CA. The output of RAA 46 is similarly connected to both current/prior RA multiplexer 52 and to prior row address register 54, which holds a previous RA. Multiplexers 48 and 52 are controlled by control signals from master state machine 60 to selectively output one of their respective inputs to CA/RA multiplexer 56, which in turn outputs either a CA or RA over address bus 24 to video RAM 16. The most significant bit (MSB) of the output of current/prior CA multiplexer 48 is provided as one input to multiplexer 58, which can provide either the actual MSB or a positive signal maintained at its other input as the MSB provided to multiplexer 56 for the CA.

Multiplexers 40, 44, 48, 52, 56, 58, accumulators 42, 46, and registers 50, 54 are controlled by the indicated signals from master state machine 60 shown in FIG. 5. The EOPF signal provided as an input to multiplexer 44 is the overflow output of CAA 42.

Figure 3:
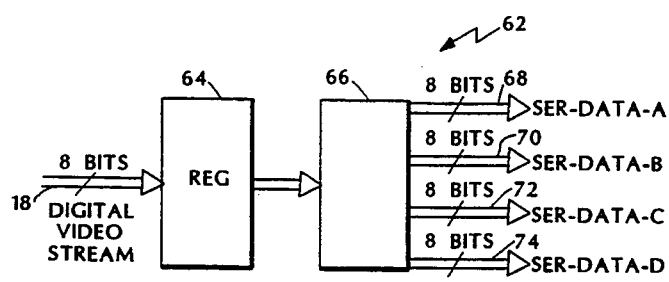
FIG. 3 is a block diagram of a video data expander of the FIG. 1 video memory controller.

Referring to FIG. 3, there is shown video data expander 62 of video memory controller 14. It includes 8-bit pixel register 64, to clock in the digital video stream on bus 18, and 8-bit to 32-bit expander circuit 66, which simply provides the 8-bit input to it as four separate 8-bit outputs 68, 70, 72, 74 connected to respective video RAM banks (FIG. 6).

Video RAM serial clock generator 76 includes video control input generator (VCIG) 78 and serial clock generator 80 (SCG). Generator 76 receives the vertical synchronization (VSYNC), horizontal synchronization (HSYNC) and pixel clock (PCLK) inputs from video source 12 over control bus 20. Generator 76 also receives control signals from host computer 15 over bus 28; these include ACQ_BUSY, which indicates a beginning and end of an acquisition cycle, and ACQ-M0 and ACQ-M1, which define an acquisition mode (i.e., start with an even field, start with an odd field, start with the next field). Based upon these inputs, VCIG 78 generates the indicated control signals for master state machine 60, as discussed below. SCG 80 generates four serial clocks to clock pixel data into the serial access memory (SAM) of video RAM 16. The clocks are timed with respect to the pixel clock used to clock in pixel data to expander 62 so as to select one memory bank out of four (FIG. 6) for each 8-bit byte of pixel data being input into expander 62. To do this, the four clock signals, S-CLK-A, S-CLK-B, S-CLK-C, and S-CLK-D, all have a frequency at ¼ the rate of PCLK and have a phase shift between them equal to the period of PCLK. Thus the first 8-bit pixel is clocked in to one memory bank, the next 8-bit pixel is clocked in to the second memory bank, and so on.

Referring to FIG. 5, master state machine 60 receives the indicated control signals from VCIG 78 and other control signals from host 15 over bus 28. Master state machine 60 outputs the indicated control signals used by address generator 34 and also outputs control signals over video RAM control bus 26. The control signals used by address generator 34 include: a CAA enable control signal (EN_CAA); an RAA enable control signal (RAA_EN), an initial state control signal (ST-0), an RA/CA control signal (RAS_CAS), a current/prior CA control signal (OPR_CS1), and a current/prior RA control signal (OPR_RS1). The signals on bus 26 are the standard video RAM control signals RAS, CAS, ~WE, ~DT, ~SE, and DSF. As discussed below, master state machine 60 has the states described in FIGS. 10–11 in order to provide a sequence of read transfer cycle (TRD), write transfer cycle (TWR), split read transfer cycle (STRD), split write transfer cycle (STWR), and pseudo write transfer cycle (PW) to insure that interlaced data are seamlessly converted to noninterlaced linear memory format. These cycles are executed by various combinations of the RAS, CAS, ~WE, ~DT, ~SE, and DSF signals according to truth tables supplied by the video memory manufacturer, as is well known in the art.

Figure 6:
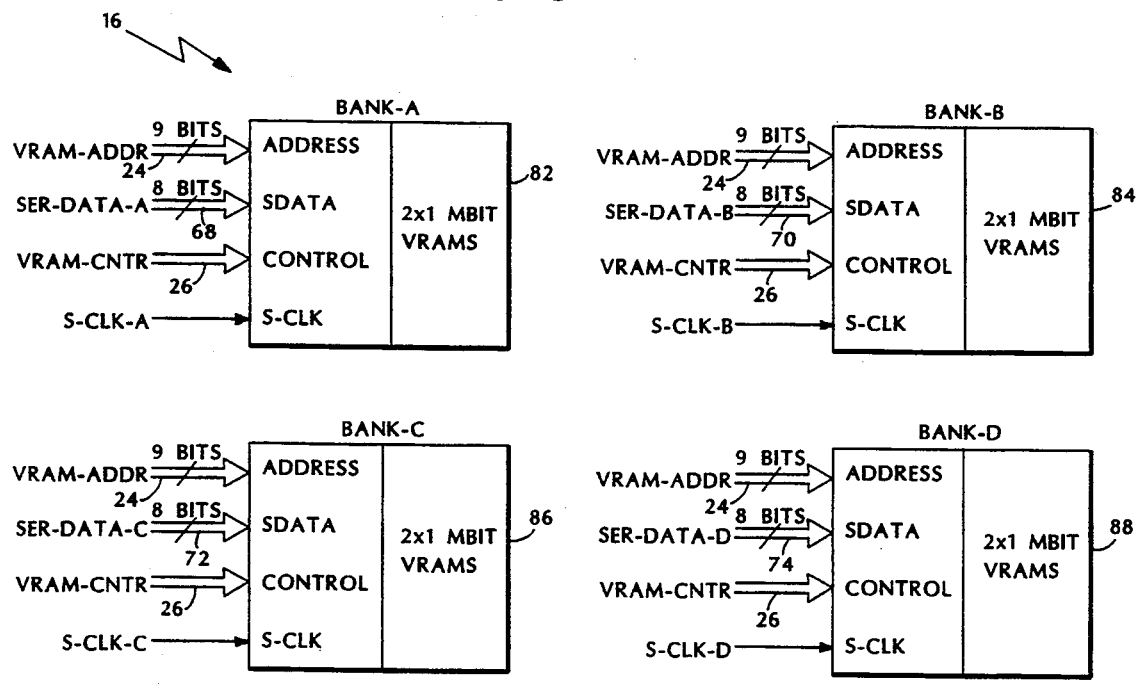
FIG. 6 is a block diagram showing the organization into banks of a video random access memory (RAM) of the FIG. 1 circuitry.

Referring to FIG. 6, it is seen that video RAM 16 includes four banks (A to D) 82, 84, 86, 88. Banks 82–88 receive the same video RAM addresses and video RAM control signals over buses 24 and 26. Each bank 82, 84, 86 or 88 receives its respective serial data over bus 68, 70, 72 or 74 and its respective clock S-CLK-A, S-CLK-B, S-CLK-C or S-CLK-D. Each bank has 256K ×8 bit of RAM. Together, the four banks provide a video RAM that is 1M ×8 bits and is addressed by a 9-bit CA and a 9-bit RA.

Figure 9:
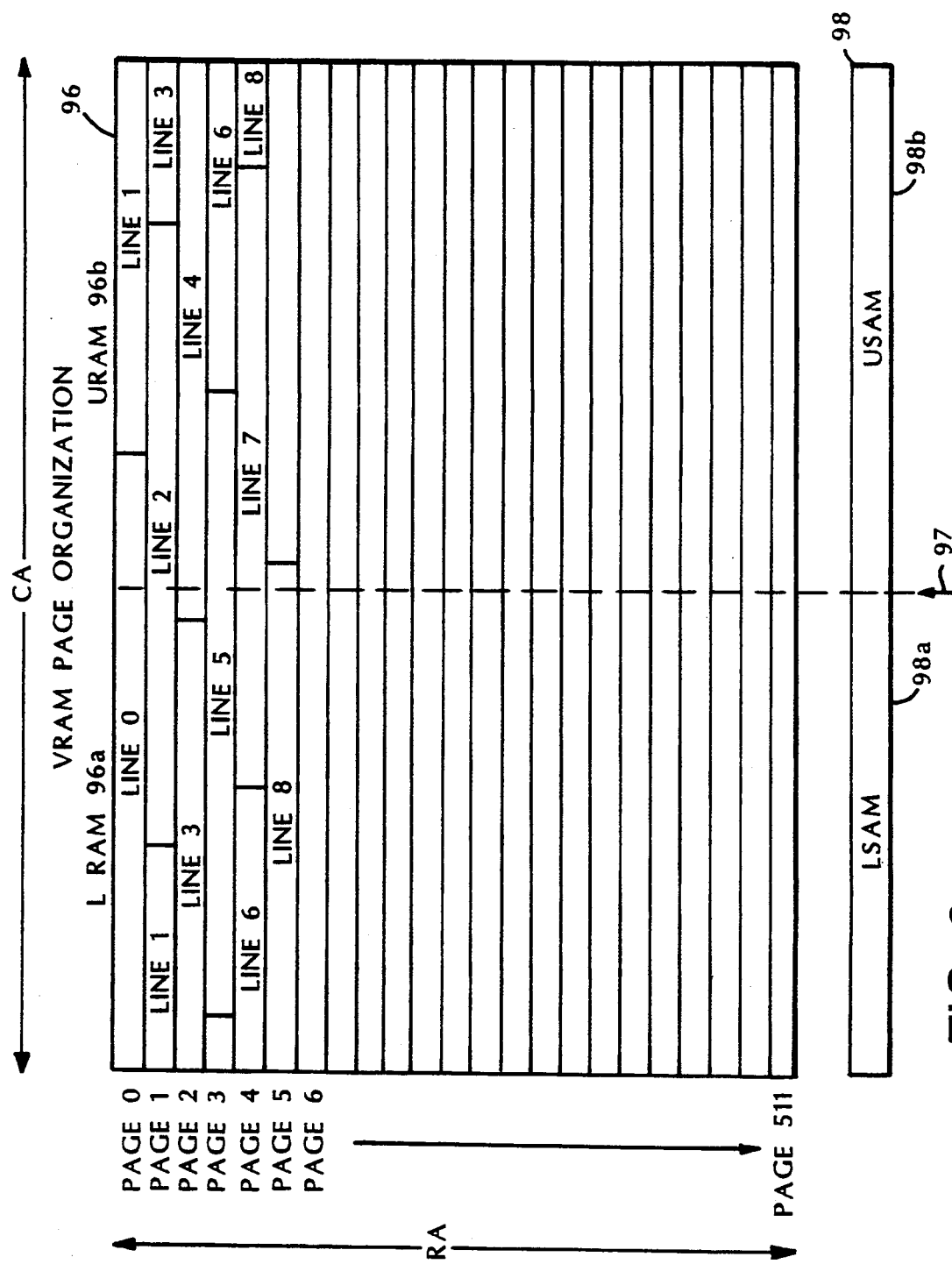
FIG. 9 is a diagram illustrating the video RAM page organization and the serial access memory (SAM) of the video RAM of the FIG. 1 circuitry.

As shown in FIG. 9, video RAM 16 includes RAM 96 and SAM 98. In RAM 96, the 9-bit CA identifies the location for storing one of 512 pixels on a "page", and the 9-bit RA identifies one of the 512 pages. The intersection of each CA and RA identifies storage for four 8-bit bytes, one in each respective bank A, B, C or D shown in FIG. 6. SAM 98 provides the same amount of storage as a page, and video RAM 16 can transfer one page or one-half page of pixel data between RAM 96 and SAM 98 at a time. Pixel data transmitted into serial access port 32 (FIG. 1) are read into SAM 98 at the location indicated by tap pointer 97, which is incremented to the adjacent position with each pixel clock, wraps around to the beginning of SAM 98 after reaching the end, and can be moved to identify a new starting location for storing the beginning of a new line, as determined by the CA provided by address generator 34. RAM 96 is partitioned into lower RAM (LRAM) 96a, for the first half of the 512 CAs, and upper RAM (URAM) 96b, for the upper half of the 512 CAs. SAM 98 is similarly partitioned into lower SAM (LSAM) 96a, for the first half of the 512 CAs, and upper SAM (USAM) 96b, for the upper half of the 512 CAs.

Operation

In operation, interlaced video from source 12 is transmitted through video memory controller 14 and stored in video RAM 16 in linear, noninterlaced, seamless fashion.

In interlaced video, even field 90 (FIG. 7, containing the even lines of a frame) is first transmitted and then odd field 92 (FIG. 8, containing the odd lines of a frame) is transmitted. Referring to FIG. 12, it is seen that VSYNC pulses are transmitted between even field 90 and odd field 92, separating the pixel data of the fields and providing timing. The relationship of the FRM_ACQ signal (generated by VCIG 78; FIG. 4) and the VSYNC pulses is also shown in FIG. 12. Referring to FIG. 13 and FIG. 14, each even and odd field 90, 92 includes a plurality of lines of pixel data 94. Adjacent lines 94 are separated by HSYNC pulses, which are used to derive the ALES signal by VCIG 78 (FIG. 4). A constraint of operation for circuitry 10 is that the pitch of the video line be less than half of the page width of RAM 96; a modified state diagram would be required to accommodate longer page widths.

Referring to FIG. 9, because the page widths in video RAM 96 are different than the widths of each line of video (equal to pitch P), some lines begin on one page and end at the beginning of the next page. For example, in the example illustrated in FIGS. 7-9, all of Line 0 (from even video field 90) is stored at the beginning of Page 0. The beginning of Line 1 (from odd video field 92) is stored at the remaining locations at the end of Page 0, and the remaining pixels of Line 1 are stored at the beginning of Page 1. The pixel data from Line 1 cannot simply be read into video RAM 96 and stored in real time at the end of Page 0 and then at the beginning of Page 1, because changing the address from one page to another takes an amount of time equal to a plurality of periods of the pixel clock at standard video rates. Thus, if the data were read in real time, there would be loss of pixel data when changing from one page to another. The invention overcomes this limitation by using SAM 98 to receive data in real time as they appear and to make read and write transfers between SAM 98 and RAM 96 in the free time period during HSYNC pulses when valid pixel data 94 do not appear. Under certain conditions data stored in one half of SAM 98 are transferred to RAM 96 while incoming video data are being written into the other half of SAM 98.

When writing pixel data into video RAM 16, all even lines of video data are first stored in RAM 96, via transfers with SAM 98, as even field 90 is received. In the example shown in FIGS. 7-9, Line 0 is first written into Page 0; Line 2 is then written into Page 1; Line 4 is written into Pages 2 and 3, and so on until the entire even field 90 has been stored. Then, after VSYNC, odd video field 92 is stored in RAM 96 via transfers with SAM 98. Line 1 is written into Pages 0 and 1 in the gap left between Lines 0 and 2; Line 3 is written into Pages 1 and 2 in the gap left between Lines 2 and 4, and so on.

When writing the pixel data into RAM 96, there are two conditions that must be accommodated with respect to the end of page boundaries. The first condition is when there is an end of page after the line being written and before the beginning of the next line to be written, as there is when writing Line 0 and preparing to write Line 2. This is referred to as "end of page flag at beginning of line" or "EOPF @ BOL". In order to accommodate this condition, before writing pixel data for the prior line (e.g., Line 0) in SAM 98, (1) the contents of page 0 are written into SAM 98, and, in the time period of the HSYNC pulse at the end of the line just written (e.g., Line 0), (2) the contents of SAM 98 (including the pixel data for the line just written) are transferred from SAM 98 into the same page of RAM 96; (3) the contents of the next page of RAM 96 are written into SAM 98; and (4) tap pointer 97 is set to the CA position for the beginning of the next line to be written (e.g., Line 2), so that when the valid pixel data then appear, they are read into SAM 98 at the proper position. Steps (1) and (3) are carried out so that when the field being written is the second field (i.e., the data have already been written for lines of the first field), the data that are already stored in RAM 96 for lines of the first field are maintained.

The second end of page condition is when the data in a particular line are to be written into locations on two pages, e.g., Line 1, which is written into Page 0 and Page 1. This condition is referred to as "end of page flag at end of line" or "EOPF @ EOL". The steps taken to preserve prior data (by writing from RAM 96 to SAM 98 prior to reading the pixel data) and the steps taken to transfer the data from SAM 98 to RAM 96 are more complicated for this condition than for EOPF @ BOL, because both the preserving of prior data and the storing of present data are split transfers involving different pages. In order to accommodate this condition, prior to receiving incoming pixel data, there is a split-transfer read operation in which the contents of URAM 96b for the upper page and the contents of LRAM 96a for the lower page are read into SAM 98. The pixel data for the line are then read into SAM 98. When tap pointer 97 goes from one portion (LSAM 98a or USAM 98b) of SAM 98 to the other, the contents of the inactive portion are transferred to the corresponding portion (LRAM or URAM) of RAM 96 at the appropriate page simultaneously with writing of incoming pixel data into the active portion. When HSYNC is reached, (1) the contents of the portion of SAM 98 (LSAM 98a or USAM 98b) that just received pixel data are then transferred into the corresponding portion of RAM 96, (2) the contents of a page of RAM 96 as necessary to preserve stored data are transferred to SAM 98, and (3) tap pointer 97 is set at the proper position for the next line of pixel data to be read.

When storing the pixel data in video RAM 16, address generator 34 provides CA and RA as necessary to store pixel data at the proper locations in SAM 98 and to transfer data to or from the proper page in RAM 96 under the control of state machine 60. State machine 60 also controls the operation of video RAM 16. The transfer control signal can be a transfer read operation (from RAM 96 to SAM 98) or a transfer write operation (from SAM 98 to RAM 96). The RA and TRD, TWR, STRD, and STWR make up a "transfer control signal" to control transfers between SAM 98 and RAM 96, the RA indicating the proper page in RAM 96. The CA and pseudo write command make up a "tap control signal" to control positioning of tap pointer 97 in SAM 98. The control of video memory 16 by state machine 60 and address generator 34 will now be described.

Referring to FIGS. 10-11 and the Appendix, which describes some of the abbreviations used on FIGS. 10-11, the initial state of state machine 60 is ST-13, which is entered upon powering up and is reached from any state when the ACQ_BUSY signal from host 15 over bus 28 goes low (i.e., is ~ACQ_BUSY). In ST-13, all address and VRAM control signals of video memory controller 14 are in the tri-state condition to allow host 15 to access video RAM 16. When host 15 asserts ACQ_BUSY, master state machine 60 traverses to ST-0. In this state, video memory controller 14 sequentially performs the following operations:

—Reset CAA 42 and RAA 46 by asserting RST-RAA and RST-CAA.

—Load CAA 42 and RAA 46 with SCA and SRA initial addresses from start address register 36.

Branching from ST-0 depends on the acquisition mode settings of ACQ-M0 and ACQ-M1 provided by host 15 over bus 28 to serial clock generator 80 (FIG. 4). This is shown in following table.

| | ACQ-MODE | | |
| --- | --- | --- | --- |
| | M1 | M0 | |
| ISEF | 0 | 0 | INT_FRAME_STARTING_EVEN_FIELD |
| ISOF | 0 | 1 | INT_FRAME_STARTING_ODD_FIELD |
| ISNF | 1 | 0 | INT_FRAME_STARTING_NEXT_FIELD |

Thus, if both ACQ-M0 and ACQ-M1 are low, the loading will begin with an even field; if ACQ-M0 is high, and ACQ-M1 is low, the loading will begin with an odd field; and, if ACQ-M0 is low, and ACQ-M1 is high, the loading will start with the next field.

If, for example, ACQ-M0 and M1 indicate starting with an even field, video memory controller 14 waits until EVEN from VCIG 78 goes high (based upon the timing of the VSYNC and HSYNC inputs, which identifies an even field), and then master state machine 60 traverses to ST-12. In this state, video memory controller 14 performs a transfer read (TRD) operation of a page (indicated by the RA stored in RAA 46 and output by CA/RA multiplexer 56; RAS(R)) from RAM 96 to SAM 98 (to save any prior data that would exist if this traversal had been after a field that had been written to RAM 96) and sets the CAS pointer status (CPS) to beginning of line (BOL).

Next there is an unconditional transition to ST-2. In this state, video memory controller 14 sequentially performs the following operations:

—Pseudo write (PW).
—CAA 42 adds the pitch (P) to the current column address (CA) in CAA 42.
—The CAS pointer status (CPS) is set to end of line (EOL).

In the first step of ST-2, which is PW, SAM port 32 into SAM 98 is changed to the input mode and tap pointer 97 is set to the CA stored in CAA 42 (before adding P to CA in the second step). This will define the SAM 98 starting point for incoming pixel data, which typically is zero for the beginning of a frame. The pixel data in the line are then sequentially read into SAM 98 at addresses that are incremented based upon the pixel clock. As has already been mentioned, there are four memory banks 82–88 (FIG. 6), and the respective data are stored according to clocks S-CLK-A–D from SCG 80.

In the second step of ST-2, CAA 42 adds P to the current CA in CAA 42. On FIGS. 10 and 11, the CA in CAA 42 is referred to as C, the CAS pointer. P is stored in pitch register 38 and is passed through CA input multiplexer 40 to CAA 42. The pitch is the width of a line of video data in fields 90, 92. If CAA 42 overflows (indicating that the page width of RAM 96, e.g., 512 pixels, has been reached), the end of page flag (EOPF) goes high, and RAA 46 is also incremented.

In the third step of ST-2, CPS is set to EOL to distinguish between ST-3 and provide for proper transitioning when EOPF goes high to either the EOPF @ BOL loop or to the EOPF @ EOL loop.

Branching from ST-2 depends upon the end of page flag (EOPF), acquired line end signal (ALES), and acquired field end signal (AFES) conditions. There are three loops starting from ST-2:

—ST-2 to ST-3 and directly back to ST-2,
—ST-2 to ST-3, to ST-4 and back to ST-2 (the "EOPF @ BOL loop" discussed above), and
—ST-2 to ST-6, to ST-7, to ST-8, to ST-3 (and from there to ST-2 directly or through ST-4)(the "EOPF @ EOL loop" discussed above).

The first loop is followed if EOPF is low at the end of ST-2 and still remains low after CA is updated in ST-3. The second loop is followed if EOPF is low at the end of ST-2 and is high after CA is updated in ST-3. The third loop is followed if EOPF is high at the end of ST-2. In every loop, operations are performed during the time when HSYNC is asserted, i.e., when there are no valid pixel data to be read into memory.

In the first loop, state machine 60 alternates between ST-2 and ST-3. This loop is entered if the CAS pointer (C) in CAA 42 does not cross a video RAM page boundary (512 in the example), and consequently EOPF is low. Every time that state machine 60 traverses from ST-2 to ST-3 or from ST-3 to ST-2, tap pointer 97 moves to a new address (C=C+P) in ST-2 and in ST-3. This corresponds to a new end of line address at the end of ST-2 and a new beginning of line address at the end of ST-3. Thus, every time that state machine 60 returns to ST-2 and enters the pseudo write mode, SAM 98 will begin writing data into SAM 98 at the appropriate linear address that is 2 P greater than the last time that data were written, skipping over the data just written and leaving a gap for the adjacent line from the other field of data. For example, after writing the end of Line 0, by adding the twice the pitch (twice the length of a line) to C, the beginning of line for Line 2 is spaced from the beginning of line for Line 0 by the space of two lines (Line 0 and Line 1).

Once C crosses the page boundary, EOPF will be high, and state machine 60 will enter the second or third loop. If C crosses the page boundary at the beginning of line (BOL), which will occur in ST-3, then the second, EOPF @BOL, loop is followed. If C crosses the page boundary at EOL (ST-2), then the third, EOPF @ EOL, loop is followed.

The EPOF @ BOL loop starts at ST-4. In this state, video memory controller 14 sequentially performs the following operations:

—Transfer write (TWR), which transfers the contents of SAM 98 (including pixel data just written) to RAM 96.
—Transfer read (TRD) next page from RAM 96 to SAM 98 (to save previously written video data from previous fields, if any, when writing the next line).
—Set tap pointer 97 to beginning of next line.

From ST-4, state machine 60 unconditionally traverses to ST-2 and performs the pseudo write and other operations indicated there. The diagram on FIG. 11 near ST-4 shows as dark bars the lines of data written, on two different pages, before and after the operations of the EOPF @ BOL loop.

The EPOF @ EOL loop starts from ST-6. In this state, video memory controller 14 sequentially performs the following operations:

—Transfer write (TWR), which transfers the contents of SAM 98 to RAM 96.

—Transfer read (TRD) same page from RAM 96 to SAM 98, to change SAM 98 to output mode.

—Split transfer read (STRD) lower half of next page to LSAM.

—Pseudo write (PW).

As a result of the first three operations, USAM 98b holds the upper half page from URAM 96b, and LSAM 98a holds the next half page from LRAM 96a. This permits seamless transition from the current page to the next page when inputting pixel data into SAM port 32. Pseudo write (PW) changes serial access port 32 to the input mode and sets tap pointer 97 to the CA for the BOL. SAM 98 is now ready to accept incoming pixel data. As incoming pixel data are read into SAM 98, tap pointer 97 moves to the end of USAM 98b. When tap pointer 97 crosses the SAM upper limit, QSF (a video RAM output indicating SAM status) changes from high to low. QSF high means USAM 98b is active, and QSF low means LSAM 98a is active.

Upon QSF going low, state machine 60 traverses to ST-7. In this state, video memory controller 14 initiates a split transfer write (STWR), transferring the contents of USAM 98b to URAM 96b. This occurs at the same time that LSAM 98a receives incoming pixel data.

At the end of the active HSYNC pulse, VCIG 78 (FIG. 4) asserts acquired line end signal (ALES), and state machine 60 traverses to ST-8. In this state, the video memory controller 14 sequentially performs the following operation:

—OPR_USAM, which involves adding the most significant bit (256) to the current C-value at multiplexer 58 (FIG. 2).

—Pseudo write (PW) to change serial data port 32 to the input mode and to move tap pointer 97 to USAM, making USAM active, permitting split transfer from the inactive LSAM 98a.

—Split transfer write (STWR), transferring LSAM 98a to LRAM 96a, saving the second part of the current line.

—Transfer read (TRD), to load a new whole page from RAM 96 to SAM 98.

From ST-8, state machine 60 unconditionally traverses to ST-3, finishing the EOPF @ EOL loop.

If during ST-2, ST-6 or ST-7, VCIG 78 (FIG. 4) asserts the acquired field end signal (AFES), state machine 60 traverses to ST-5. In this state, video memory controller 14 performs a transfer write (TWR) to save the end part of the field to RAM 96.

The beginning of field (BOF) or EVEN-CHG then activates ST-0, and state machine 60 has finished recording one field. EVEN-CHG is a signal generated when EVEN changes level. If the recorded field was, for example, the even field, then state machine 60 will traverse to ST-1, and the second, odd field, writing process is repeated, storing the odd lines in the gaps left in video RAM memory space 96 between the even lines and maintaining the even lines.

FIG. 12 shows the transitioning between the enable and disable states of the serial clock generator and other states.

Other embodiments of the invention are within the scope of the following claims.

APPENDIX

| | |
|---|---|
| P | ACQ_PITCH_SIZE |
| SRA | START_RAS_ADDRESS |
| SCA | START_CAS_ADDRESS |

-continued

APPENDIX

| | |
|---|---|
| CPS | CAS_POINTER_STATUS |
| BOI | BEGINIG_OF_LINE |
| EOI | END_OF_LINE |
| | CPS=[o, BOL, EOL] |
| C | CAS_POINTER |
| R | RAS_POINTER |
| TAP | SAW_TAP_POINTER |
| | TAP=[LSAM, USAM] |
| | QSF=[0,1] |
| LSAM | LOW_SERIAL_ACCESS_MEMORY |
| USAM | UPPER_SERIAL_ACCESS_MEMORY |
| QSF | VRAM_SPECIAL_FUNCTION_OUTPUT |
| PW | PSEUDO_WRITE_VRAM_OPERATION |
| TWR | TRANSFER_WRITE_VRAM_OPERATION |
| TWD | TRANSER_READ_VRAM_OPERATION |
| STWR | SPLIT_TRANSFER_WRITE_VRAM_OPERATION |
| STRD | SPLIT_TRANSFER_READ_VRAM_OPERATION |
| TRIS | TRISTATE_ADDR_DATA_CONTROL_TO_VRAM |
| OPR_USAM | ADD_MSB_TO_CURRENT_COLUMN_ADDRESS |
| EOPF | END_OF_PAGE_FLAG (EOPF=1, IF C >= 512) |
| C:=C+P | CAS ADD PITCH (OPR_CAP) |
| R:=R−1 | RAS 1 "EN_RAA" BACK IN RAS PIPE (OPR_RS1) |
| EN_RAA | ENABLE_RAS_ACCUMULATOR |
| EN_CAA | ENABLE_CAS_ACCUMULATOR |
| RST_CAA | RESET_CAS_ACCUMULATOR |
| ALES | ACQUIRED_LINE_END_SIGNAL |
| AFES | ACQUIRED_FIELD_END_SIGNAL |
| EVEN | INDICATES EVEN FIELD |
| FRM_ACQ | THE_ACQUIRED_FRAME |
| BOF | BEGINNING_OF_FIELD |
| EOF | END_OF_FIELD |
| ACQ_DONE | LEGAL_ACQUIRING_FRAME_END_TO_HOST |
| ACQ_BUSY | ASYNC_ACQUISITION_BEGINNING_FROM_HOST |

What is claimed is:

1. Apparatus for storing a digitized stream of interlaced video image data in a memory in noninterlaced form as said data are received comprising a video memory having a random access memory (RAM) accessed by column and row addresses, said row addresses corresponding to pages in said memory having a page width, a parallel port for accessing said RAM directly, a serial port, and a serial access memory (SAM) to sequentially store data input to said serial port and to store up to a page of data at one time, said SAM having a movable tap to control the location in said SAM at which data are stored, said SAM including a lower SAM (LSAM) that corresponds to lower column addresses and an upper SAM (USAM) that corresponds to upper column addresses, said RAM including a lower RAM (LRAM) that corresponds to said lower column addresses and an upper RAM (URAM) that corresponds to said upper column addresses, said video memory having a control input for receiving a transfer control signal to transfer blocks of data of the same size as said LSAM and said USAM between said LSAM and said LRAM and between said USAM and said URAM, said video memory also having a control input for receiving a tap control signal to control the location of said tap, a video memory controller that includes a video input circuit that receives a digitized interlaced video signal and outputs said signal in the form of a stream of digitized pixel values to said serial port, said video memory controller also receiving a horizontal sync pulse indicating a HSYNC gap in said stream between the digitized data at the end of one horizontal video line and the digitized data at the beginning of another horizontal video line, said video memory controller also receiving a vertical synchronization pulse indicating the end of one field and the beginning of the next field, said controller responding to the occurrence of said horizontal sync pulse by sending a transfer control signal and a tap control signal to said control input of said video memory, said transfer control signal causing said video memory to write the data stored in said LSAM into said LRAM and the data stored said USAM into said URAM and to read back data stored at a row address in said LRAM into said LSAM and to read back data stored at a row address in said URAM into said USAM in the time period corresponding to said HSYNC gap between horizontal video lines, said tap control signal causing the next digitized pixel values provided to said serial port to be stored in said SAM at a location spaced by at least the pitch P from the location of the most recently stored data to provide memory space necessary for storage of data of a video line, where P is the number of pixels in a horizontal line of video data.

2. The apparatus of claim 1 wherein said transfer control signal causes said data read from said LRAM and URAM to be read from the same row.

3. The apparatus of claim 1 wherein said transfer control signal causes said data read from said LRAM and URAM to be read from different rows.

4. The apparatus of claim 3 wherein said transfer control signal causes data read from the same row in the LRAM and URAM to be written into the LSAM and USAM and then causes data read from the next row in the LRAM to be written into said LSAM.

5. The apparatus of claim 1 wherein said transfer control signal causes said video memory to write said data stored in said LSAM and said USAM into said LRAM and said URAM on the same page.

6. The apparatus of claim 1 wherein said video memory controller includes
an address generator that generates a column address to identify a tap position with respect the next line to be stored in said SAM and a row address to identify a page in said RAM for a transfer between said RAM and said SAM, said address generator outputting said column address and said row address over a video memory address bus connected to said video memory,
said transfer control signal including said row address,
said tap control signal including said column address.

7. The apparatus of claim 6 wherein said address generator includes a column address accumulator (CAA) that is connected and controlled so as to add P to the current column address and output the sum as said column address outputted over said video memory address bus.

8. The apparatus of claim 7 wherein said CAA has an overflow output that outputs an end of page flag (EOPF) signal when said CAA overflows upon reaching a value equal to said page width of said RAM, and wherein said address generator has a row address accumulator (RAA) that is incremented by said EOPF signal.

9. The apparatus of claim 8 wherein said address generator includes a start address register that is connected to provide its output as an input to said CAA or said RAA.

10. The apparatus of claim 8 wherein said address generator includes a pitch register that provides P as its output is connected to input P to said CAA.

11. The apparatus of claim 8 wherein said address generator includes a prior column address register connected to receive as its input the column address output by said CAA.

12. The apparatus of claim 11 wherein said address generator includes a prior row address register connected to receive as its input the row address output by said RAA.

13. The apparatus of claim 8 wherein said address generator includes a CA/RA multiplexer connected to selectively output either said column address received from said CAA or said row address received from said RAA as its output over said video memory address bus.

14. The apparatus of claim 11 wherein said address generator includes a current/prior CA multiplexer connected to selectively output either the column address output by said CAA or the column address output by said prior column address generator.

15. The apparatus of claim 12 wherein said address generator includes a current/prior RA multiplexer connected to selectively output either the row address output by said RAA or the row address output by said prior row address generator.

16. The apparatus of claim 1 wherein said video memory has a plurality of banks of RAM that are addressed by the same address bus and controlled by the same said control signals, and wherein said video memory controller includes a serial clock generator that receives a pixel clock as an input and outputs a plurality of phase shifted serial clocks for respective said banks of RAM.

17. The apparatus of claim 6 wherein said video memory controller includes
a master state machine that controls said address generator with address generator control signals, generates transfer read and transfer write signals and a tap movement signal and outputs said transfer read and transfer write signals and said tap movement signal over a video memory control bus connected to said video memory,
said transfer control signal including said transfer read and transfer write signals,
said tap control signal including said tap movement signal.

18. The apparatus of claim 17 wherein said video memory controller includes a video control input generator that receives said horizontal synchronization signal and said vertical synchronization signal as inputs and outputs timing and status signals to said master state machine.

19. The apparatus of claim 17 wherein said master state machine generates CAA enable control signal, and wherein said address generator includes a column address accumulator (CAA) that is connected and controlled so as to add the pitch P to the current column address upon receiving said CAA enable signal and output the sum as said column address outputted over said video memory address bus.

20. The apparatus of claim 19 wherein said master state machine generates an RAA enable control signal, and wherein said CAA has an overflow output that outputs an end of page flag (EOPF) signal when said CAA overflows upon reaching a value equal to said page width of said RAM, and wherein said address generator has a row address accumulator (RAA) that adds said EOPF signal to the current row address value upon receiving said RAA enable signal.

21. The apparatus of claim 20 wherein said master state machine generates an initial state control signal, and wherein said address generator includes a start address register that is connected to provide its output as an input to said CAA or said RAA through respective RA and CA input multiplexers when said RA and CA input multiplexers receive said initial state control signal in an asserted state.

22. The apparatus of claim 20 wherein said address generator includes a pitch register that is connected to provide its P output as an input to said CAA through said CA input multiplexer when said initial state control signal is in an unasserted state.

23. The apparatus of claim 20 wherein said address generator includes a prior column address register connected to receive as its input the column address output by said CAA and to be enabled by said CAA enable control signal.

24. The apparatus of claim 23 wherein said address generator includes a prior row address register connected to receive as its input the row address output by said RAA and to be enabled by said RAA enable control signal.

25. The apparatus of claim 20 wherein said master state machine generates an RA/CA control signal, and wherein said address generator includes a CA/RA multiplexer connected to selectively output either said column address received from said CAA or said row address received from said RAA as its output over said video memory address bus.

26. The apparatus of claim 23 wherein said master state machine generates a current/prior CA control signal, and wherein said address generator includes a current/prior CA multiplexer connected to selectively output either the column address output by said CAA or the column address output by said prior column address generator in response to said current/prior CA control signal.

27. The apparatus of claim 24 wherein said master state machine generates a current/prior RA control signal, and wherein said address generator includes a current/prior RA multiplexer connected to selectively output either the row address output by said RAA or the row address output by said prior row address generator in response to said current/prior RA control signal.

28. The apparatus of claim 17 wherein said video memory controller includes a column address accumulator (CAA) that is connected and controlled so as to add the pitch P to a current column address maintained by it, and said state machine employs an end of page flag (EOPF) signal indicating that the tap is about to cross the page boundary of said SAM, said EOPF signal being used as a condition to determine transitions out of some of the states of said master state machine.

29. The apparatus of claim 28 wherein said state machine maintains an end of line (EOL) flag and a beginning of line (BOL) flag to indicate whether the column address in the CAA identifies an EOL or a BOL.

30. The apparatus of claim 29 wherein said state machine has a first state in which said EOL flag is asserted, and a second state in which said BOL flag is asserted, said state machine transitioning from said first state to said second state after the initiation of a horizontal synchronization pulse, P being added to the current column address in said CAA in said first state and in said second state.

31. The apparatus of claim 30 wherein said state machine, when the EOPF is asserted at the same time that the BOL flag is asserted, transitions to a state in which said state machine causes the contents of said SAM to be written to a page of said RAM, and the contents of the same said page of said RAM to be written into said SAM.

32. The apparatus of claim 30 wherein said state machine, when the EOPF is asserted at the same time that the EOL is asserted, transitions to a state in which said state machine causes the contents of said SAM to be written to a page of said RAM, and the contents of the same said page of said URAM to be written into said USAM and the contents of the next page of the LRAM to be written into said LSAM.

33. The apparatus of claim 32 wherein said state machine includes a state in which the contents of the USAM are written to the URAM after said tap pointer has moved from USAM to LSAM and while data are being read into said LSAM.

34. The apparatus of claim 33 wherein said state machine includes a state in which the contents of the LSAM are written to the LRAM after the data from the same line that had been stored in USAM have been written into the URAM.

35. The apparatus of claim 17 wherein said state machine has an end of field state into which said state machine transitions in response to a vertical synchronization pulse, said state machine writing data of the last lines in a field stored in said SAM to said RAM in said state.

36. The apparatus of claim 17 wherein said state machine has a state in which said state machine causes said CAA to add P to column address and reads data from RAM to SAM in preparation for receiving an odd field.

37. The apparatus of claim 17 wherein said state machine has a state in which said state machine reads data from RAM to SAM in preparation for receiving an even field.

38. A method for storing a digitized stream of interlaced video image data in a memory in noninterlaced form as said data are received comprising
providing
a video memory having a random access memory (RAM) accessed by column and row addresses, said row addresses corresponding to pages in said memory having a page width, a parallel port for accessing said RAM directly, a serial port, and a serial access memory (SAM) to sequentially store data input to said serial port and to store up to a page of data at one time, said SAM having a movable tap to control the location in said SAM at which data are stored, said SAM including a lower SAM (LSAM) that corresponds to lower column addresses and an upper SAM (USAM) that corresponds to upper column addresses, said RAM including a lower RAM (LRAM) that corresponds to said lower column addresses and an upper RAM (URAM) that corresponds to said upper column addresses, said video memory having a control input for receiving a transfer control signal to transfer blocks of data of the same size as said LSAM and said USAM between said LSAM and said LRAM and between said USAM and said URAM, said video memory also having a control input for receiving a tap control signal to control the location of said tap, and a video memory controller, receiving a digitized interlaced video signal at a video input circuit of said video memory controller, outputting said interlaced video signal in the form of a stream of digitized pixel values to said serial port, receiving a horizontal sync pulse indicating a HSYNC gap in said stream between the digitized data at the end of one horizontal video line and the digitized data at the beginning of another horizontal video line, receiving a vertical synchronization signal indicating the end of one field and the beginning of the next field, responding to the occurrence of said horizontal sync pulse by said video memory controller sending a transfer control signal and a tap control signal to said control input of said video memory, responding to said transfer control signal by, in the time period corresponding to said HSYNC gap between horizontal video lines, writing the data stored in said LSAM into said LRAM and the data stored said USAM into said URAM, reading back data stored at a row address in said LRAM into said LSAM, and reading back data stored at a row address in said URAM into said USAM, and responding to said tap control signal by storing the next digitized pixel values provided to said serial port in said SAM at a location spaced by at least the pitch P from the location of the most recently stored data to provide memory space necessary for storage of data of a video line, where P is the number of pixels in a horizontal line of video data.

* * * * *

UNITED STATES PATENT AND TRADEMARK OFFICE
CERTIFICATE OF CORRECTION

PATENT NO.  : 5,406,311

DATED       : April 11, 1995

INVENTOR(S) : Henry S. Michelson

It is certified that error appears in the above-identified patent and that said Letters Patent is hereby corrected as shown below:

Col. 12, APPENDIX, line 7, "SAW" should be --SAM--.

Col. 12, APPENDIX, line 31, insert --RST-RAA RESET_RAS_ACCUMULATOR--.

Signed and Sealed this

Thirteenth Day of August, 1996

Attest:

BRUCE LEHMAN

*Attesting Officer*     *Commissioner of Patents and Trademarks*